(12) United States Patent
Recker

(10) Patent No.: US 12,404,690 B1
(45) Date of Patent: Sep. 2, 2025

(54) ENTRYWAY FOR A MODULAR DATA CENTER

(71) Applicant: Frank Douglas Recker, Jacksonville, FL (US)

(72) Inventor: Frank Douglas Recker, Jacksonville, FL (US)

(\*) Notice: Subject to any disclaimer, the term of this patent is extended or adjusted under 35 U.S.C. 154(b) by 0 days.

(21) Appl. No.: 19/230,869

(22) Filed: Jun. 6, 2025

(51) Int. Cl.
| | | |
|---|---|---|
| *E04H 5/00* | (2006.01) | |
| *B01D 46/00* | (2022.01) | |
| *B01D 53/26* | (2006.01) | |
| *B01D 53/30* | (2006.01) | |
| *E05B 63/14* | (2006.01) | |
| *H05K 7/14* | (2006.01) | |

(52) U.S. Cl.
CPC ........... *E04H 5/00* (2013.01); *B01D 46/0027* (2013.01); *B01D 53/26* (2013.01); *B01D 53/30* (2013.01); *E05B 63/143* (2013.01); *H05K 7/1497* (2013.01); *B01D 2257/80* (2013.01); *B01D 2259/4508* (2013.01); *B01D 2279/50* (2013.01); *E04H 2005/005* (2013.01)

(58) Field of Classification Search
CPC ................................ E04H 5/00; E05B 63/143
See application file for complete search history.

(56) References Cited

U.S. PATENT DOCUMENTS

| | | | | |
|---|---|---|---|---|
| 2,202,783 | A * | 5/1940 | Morrell | E04B 2/58 52/475.1 |
| 5,181,353 | A * | 1/1993 | Harrington, Jr. | E04B 1/12 52/309.9 |
| 5,353,560 | A * | 10/1994 | Heydon | E04B 7/22 52/592.1 |
| 5,822,940 | A * | 10/1998 | Carlin | E04B 2/7453 52/459 |
| 7,165,374 | B2 * | 1/2007 | Ohanesian | B28B 11/042 52/424 |
| 10,999,954 | B2 * | 5/2021 | Rancic et al. | H05K 7/20745 |
| 11,917,788 | B1 * | 2/2024 | Welsko | H05K 7/2029 |
| 2011/0067331 | A1 * | 3/2011 | Grinsted | E04B 1/14 52/309.4 |
| 2016/0014995 | A1 * | 1/2016 | Bruno | A01K 1/033 119/482 |
| 2016/0208489 | A1 * | 7/2016 | Gibson | E04B 1/14 |
| 2020/0344916 | A1 * | 10/2020 | Rancic | H05K 7/2059 |
| 2021/0219460 | A1 * | 7/2021 | Bailey | H05K 7/1497 |
| 2025/0068709 | A1 * | 2/2025 | Crawford | H05K 7/1497 |
| 2025/0126739 | A1 * | 4/2025 | Roy | H05K 7/20745 |

\* cited by examiner

*Primary Examiner* — Joshua K Ihezie
(74) *Attorney, Agent, or Firm* — Lawrence J. Gibney

(57) ABSTRACT

This application describes the entryway to a remote or modular data center to provide access to data to rural customers or customers that do not have the advantage of large data centers nearby. The entryway to the remote data center must be equipped with safeguards to prevent the intrusion of dust, dirt and moisture from entering the data center storage facility. A two door system with a filtration system and other safeguards is anticipated that will limit the amount of contaminants that can enter the storage facility.

6 Claims, 5 Drawing Sheets

ENTRYWAY FOR A MODULAR DATA CENTER

BACKGROUND OF THE INVENTION

A. Field of the Invention

This application describes the entryway door for a remote or modular data center. Modular data centers are data centers that are usually placed in rural areas; the data centers are critical to supply data to remote or rural areas to ensure that individuals who live in isolated areas have access to information quickly.

One of the issues in the rural areas is data may or may not transfer effectively through the large data centers to remote areas efficiently. Rural areas simply do not have the infrastructure that large metropolitan areas would possess such as cell towers and connective equipment that provide large groups of data to a large metropolitan area.

The location of the remote data centers would be installed so the data can be relatively close to the end users and user-supported groups such as schools, hospitals, warehouses, and first responders to name just a few. In rural areas which do not have large infrastructure, the data collection is somewhat fragmented, unreliable, and therefore not dependable. The mobile data centers which are contemplated in this case would make that data available so that it is reliable and not fragmented.

The remote or modular data centers are large independent stations that provide its own power source through its own generating equipment; however, it is imperative for the remote or modular data centers to remain as clean to protect the internal storage of the data center. The data center would consist of a compilation of rows of storage racks which individual customers would rent space to provide critical data to the specific providers.

It is imperative to protect the data and to protect the data within the structure to have clean doorways or entranceways which are carefully controlled so that the environment from the outside does not enter the data center such as dust, dirt and moisture which can corrupt any operating equipment.

Power must be maintained to the data center at all times and a power supply likely a generator is provided.

B. Prior Art

There are many other prior art references to data centers which provide the information locally; however, it is the entryway that is of particular interest in providing a clean environment so the individual can walk in and out of the data center without contaminating the interior of the data center.

BRIEF SUMMARY OF THE INVENTION

The entryway is attached to the modular data center and has an entryway door as well as an air filtration system which will initially blow a strong stream of air to brush any contaminants off the individual. The entry way is then closed and entrance to the data center may occur.

The entrance to the data center will consist of opening an interior door which will lead directly to the data center. The individual cannot enter the data center until the exterior door has been closed and sealed. The interior area for the entryway will security cameras as well as housing of all electrical equipment including all necessary cables.

This separate room or anteroom (entryway) should provide an environmentally controlled space between the data room and the outside environment and will also consists of a space to conduct secure meetings, if needed. A portion of the anteroom will provide technicians a space to work without providing access to the data center thereby eliminating both security and environmental threats (for example, the introduction of moisture, particulates, and other contaminants) to the equipment in the data room. The modular data centers contain individual data center modules housed in a data room which must be protected from contamination at all times.

Additionally, the modular data center will have its own source of power which will operate the air conditioning system and filtration systems.

Additionally, the entryway or anteroom will have a separate air conditioning system for comfort as well as control of humidity and a filtration system for that space. A blower system in the entryway is equipped to brush particles from the person entering the entryway or anteroom.

After the particulates are brushed away from the individual, the particulates are forced into filters to ensure the cleanliness of the space before an individual is allowed to enter the data center. The modular data centers although modular and portable are designed for use in environments that are potentially damaging to computer equipment such as environments that are comprised of dust, dirt and high humidity.

In one embodiment, each data center module is comprised of a location for electronic equipment such as a rack with slots or shelves and at least one redundant cooling system, a power supply system, and a fire suppression system that is optionally redundant. The anteroom or entryway will have an air lock preventing access to the data room through a door or pair of doors without directly exposing equipment in the data room to the outside environment.

The anteroom or portion thereof may serve as a meeting room where external communication lines, fiberoptics, ethernet, coaxial and other forms of hard wiring, and modular data center where they can be connected to the equipment are contained within the data room. This space will allow the technician to work on the cables without having to enter the data room itself. This arrangement will limit access to and potential contamination of the data room from the environmental external to the modular data center while still permitting access by personnel for many purposes including changing the input connections to the data center modules and changing, making, or breaking inner connections between users of the data center modules.

The purpose of the anteroom or entryway is to prevent direct exposure to the equipment in the data room to the materials in the environment including moisture that can potentially damage the equipment. The anteroom or entryway will be equipped with an interlock system that prevents both the entrance from the exterior and the entrance to the data control room from being open at the same time. An override for the doors will be provided in the event of an emergency. The interlock may be mechanical or electronic.

The atrium or entryway will also be equipped with a moisture sensor to detect the moisture content of the anteroom and display the output in the anteroom, and the data room, thereby allowing operators to determine the range where it is safe to open the interior door of the anteroom to the data room.

A data center is a large structure that houses computer components including large storage elements for data as the name would imply. A user such as ABC Corporation would rent some of the space in the data center from the provider of the data center. The advantages of having a data center in a remote location are its cost effectiveness and providing information closer and more reliably to the residents of a community which can be helpful to schools, hospitals, first responders and warehouse facilities to name a few examples.

The application is seeking to patent the entryway to the data center to prevent particulates especially dust and moisture from entering the data center. Dust and excessive moisture in a data center may lead to corruption of the data that is stored.

NUMBERING REFERENCE

Figure 1:
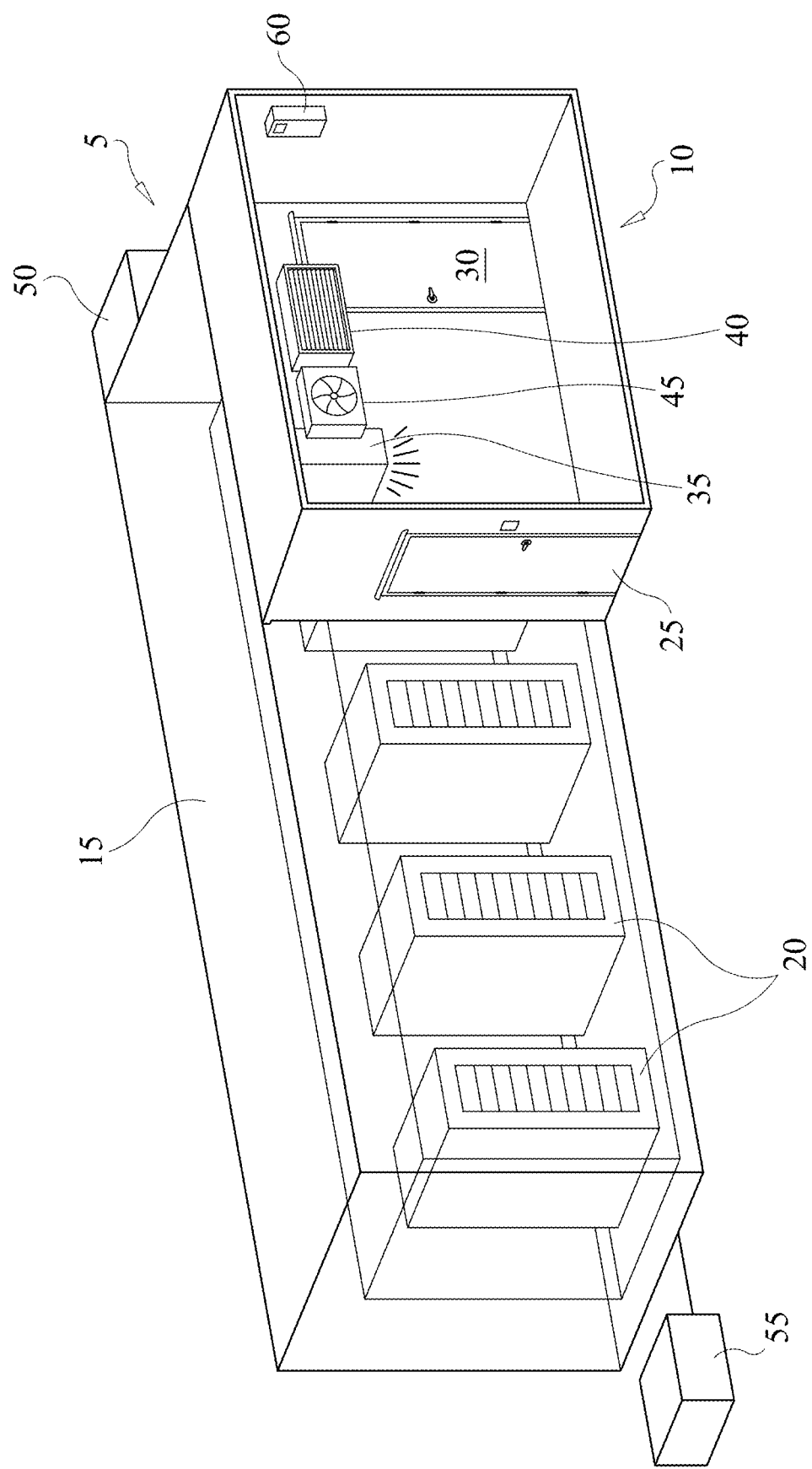
FIG. 1 is a representation of the data center with the connected entryway.
Figure 2:
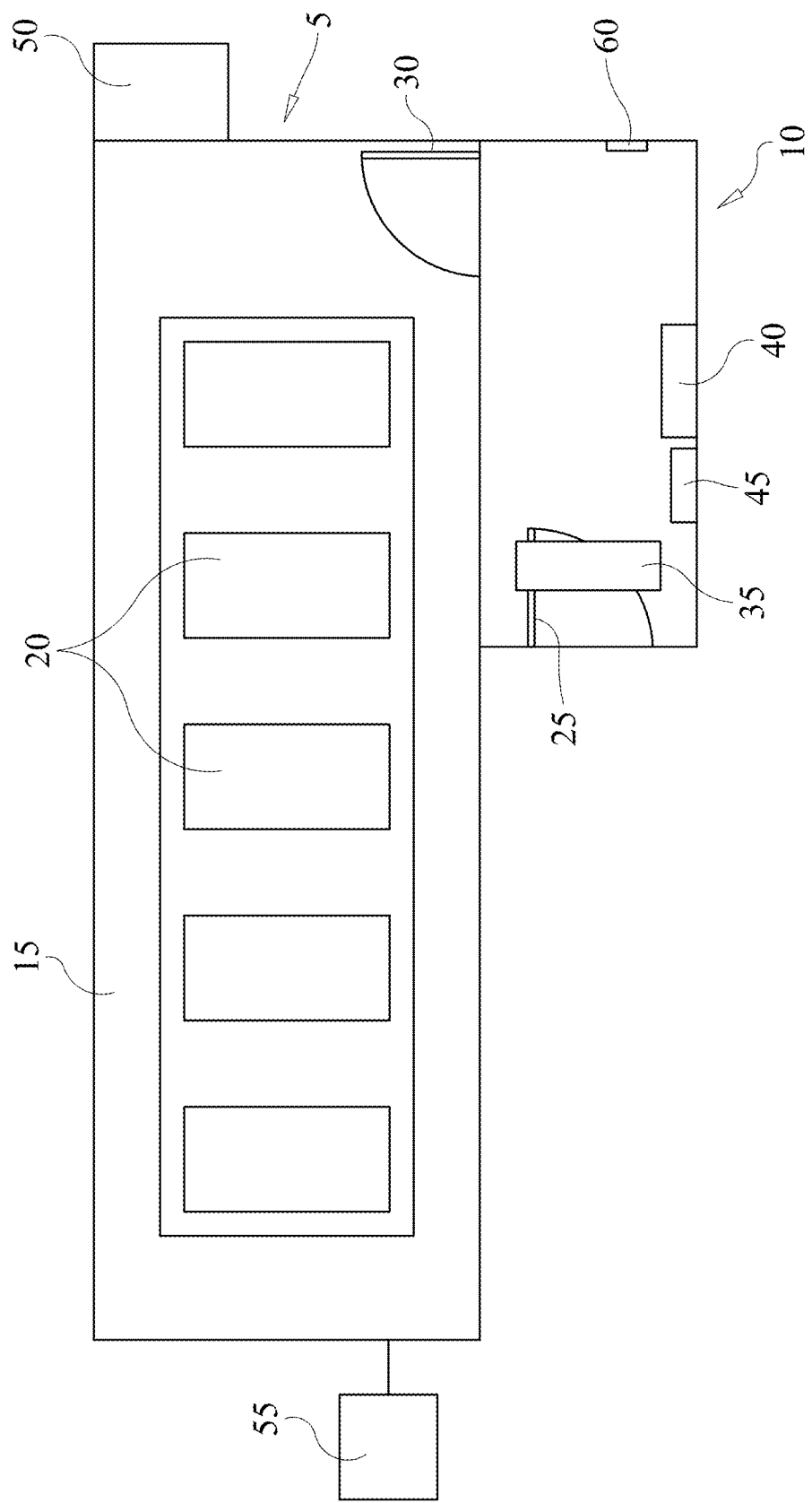
FIG. 2 is a top view of the data center with the connected entryway.
Figure 3:
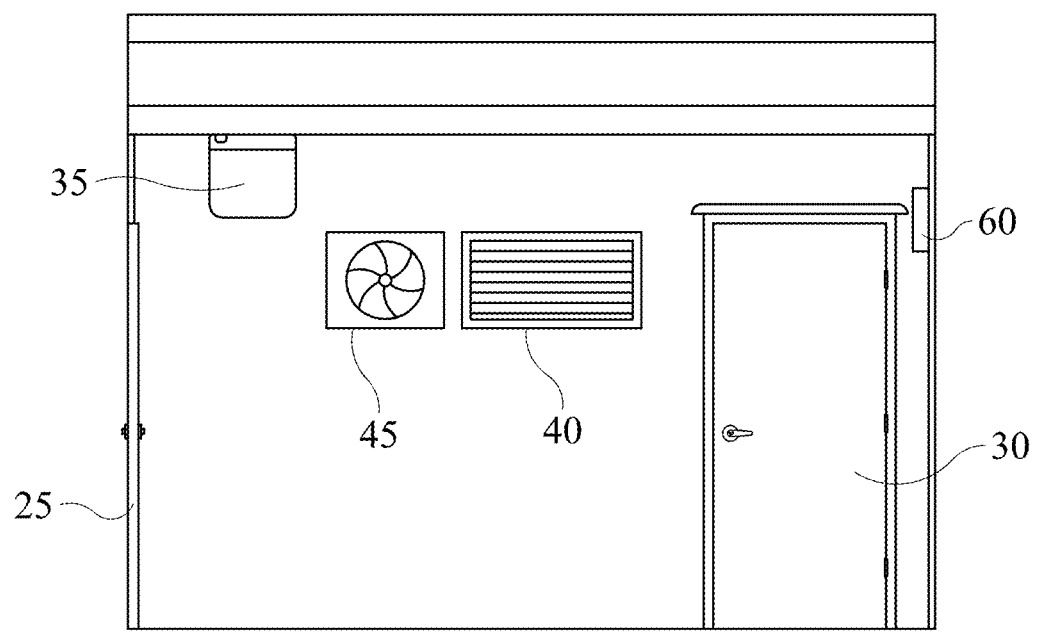
FIG. 3 is a side view of the entryway.
Figure 4:
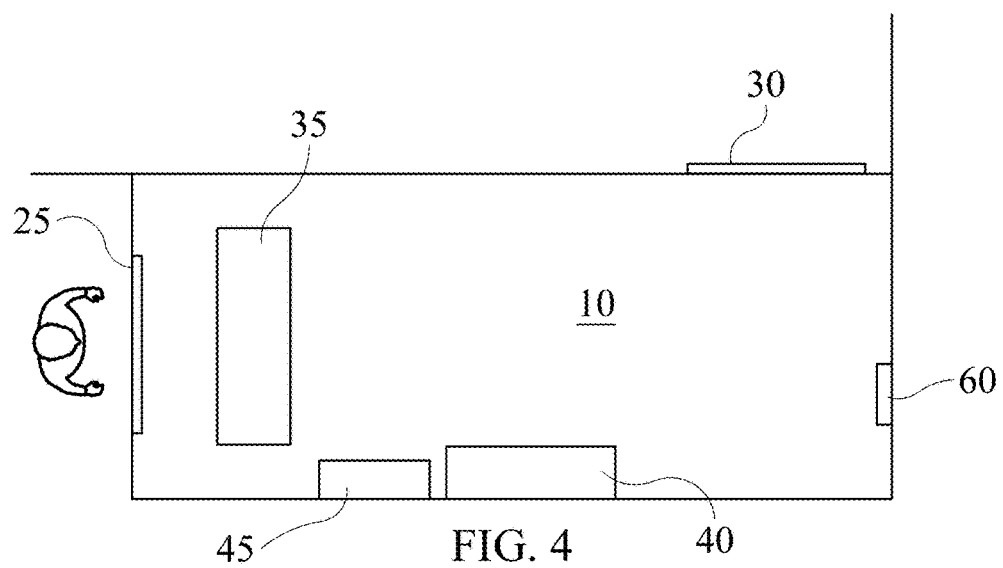
FIG. 4 is a top view of the entryway depicting a person about the enter the entryway.
Figure 4A:
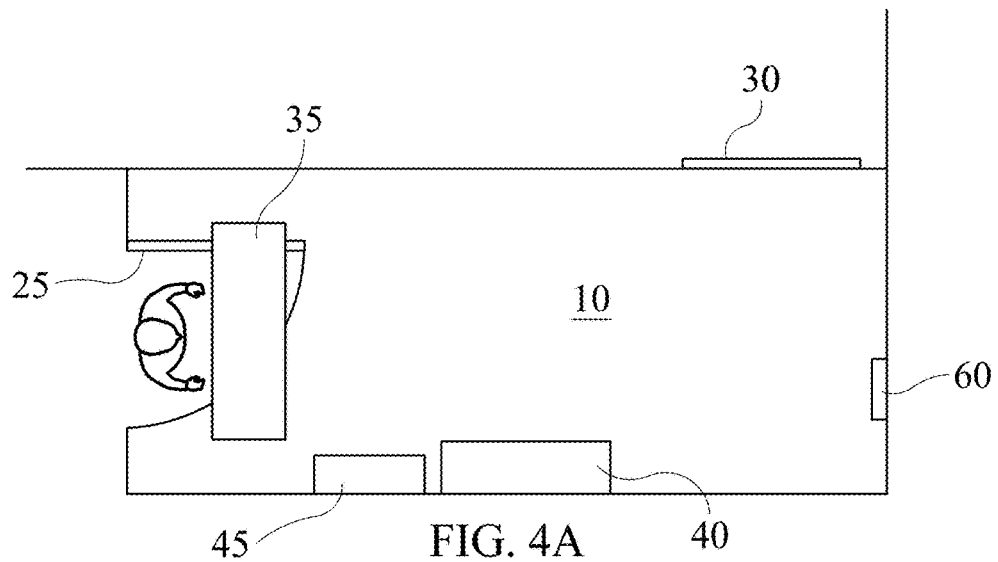
FIG. 4A is a top view of the person opening the exterior door to the entryway.
Figure 4B:
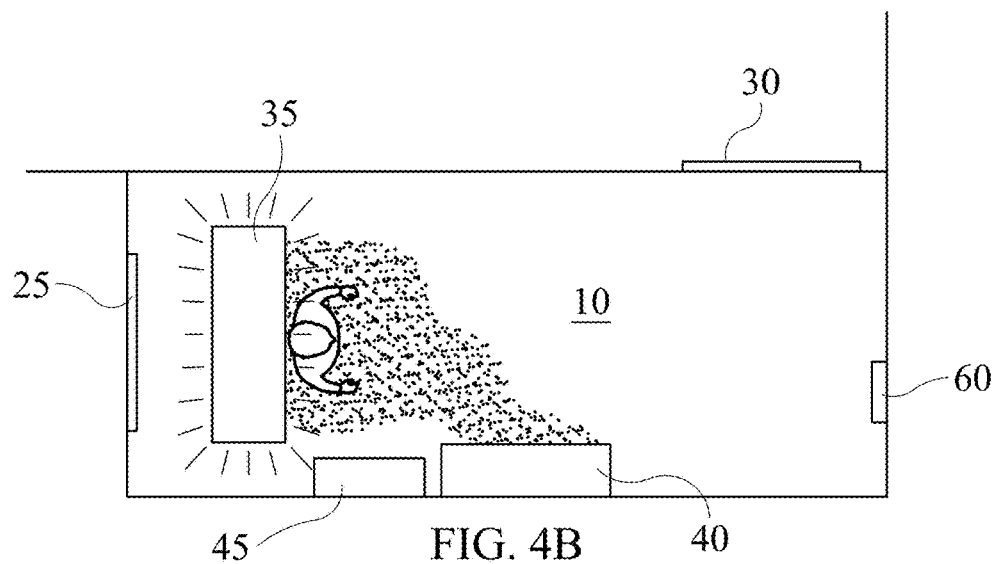
FIG. 4B is a top view of the person entering the entryway with a depiction of the blower system cleaning particles from the person.
Figure 4C:
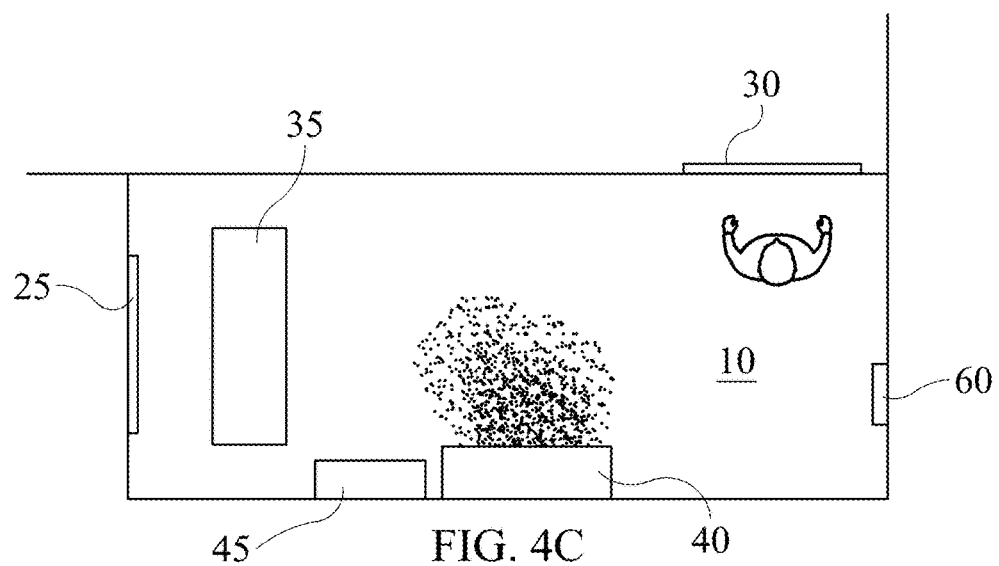
FIG. 4C is a top view of the person inside the entryway near the interior door to the data center and the depiction of the filtration system.
Figure 4D:
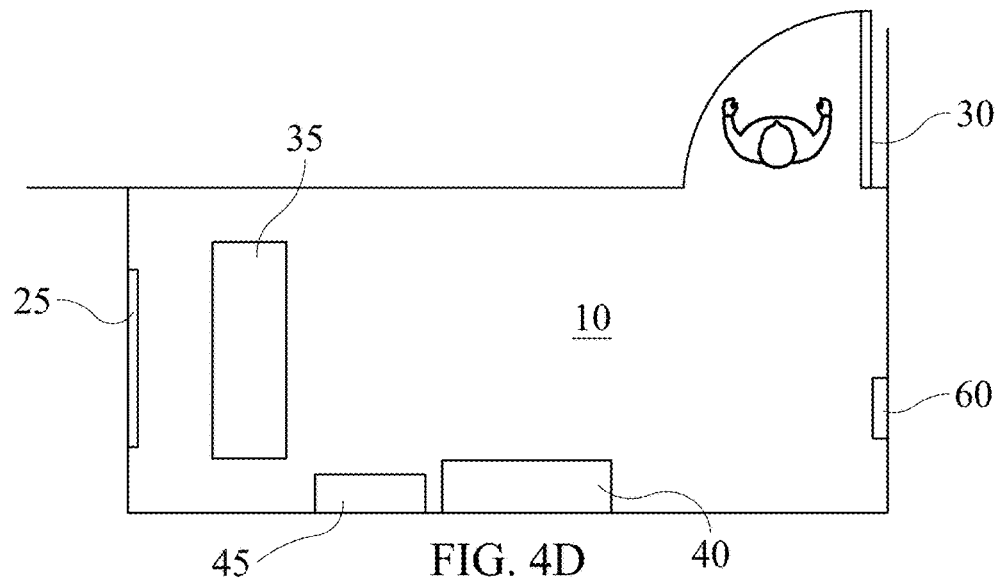
FIG. 4D is a top view of the person entering the data center through the interior door.
Figure 4E:
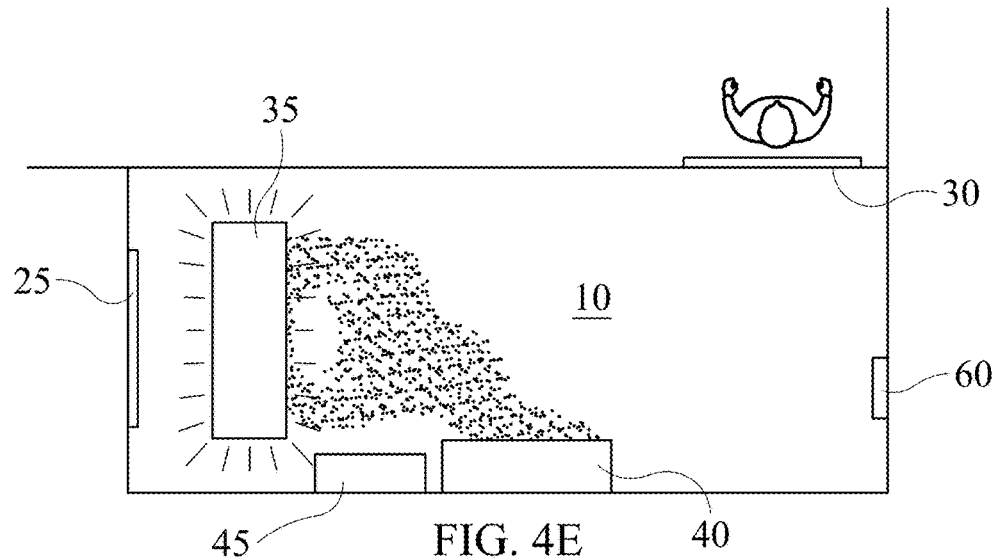
FIG. 4E is a top view of the person inside the data center with the interior door closed and the particles filtered within the entryway.

5 Device
10 Entryway
15 Modular Data Center
20 Storage in Data Center
25 Exterior Door to Entryway
30 Interior Door to Data Center
35 Blower System
40 Filtration System
45 Air Conditioning System for Entryway
50 Air Conditioning System for Data Center
55 Power Supply for Data Center
60 Moisture Monitor

DETAILED DESCRIPTION OF THE EMBODIMENTS

The entryway 10 is attached to the modular data center 15. The modular data center provides a location for storage of data in a defined structure with defined walls, a defined floor and a defined ceiling. It is anticipated that multiple vendors that require data storage will occupy the date center. The vendors may be private or government interests and may include for example, schools, warehouses, first responders and hospitals. This is a representative example of some of the providers and is not an exhaustive list.

The remote data center will be placed in a rural setting that likely does not have the infrastructure of a large metropolitan area to provide data transmission. If data is transmitted over long transmission lines or wireless technology the data may become fragmented. The placement of the modular data center in a rural setting will allow the citizens of the rural community to enjoy the same benefits as a person in a large metropolitan area.

Data storage, however, requires a clean, dust free, and moisture free environment. If contaminants reach the data storage, the data may become corrupted.

The entryway 5 in this application is designed to provide protection against dust and moisture from entering the data storage facility and corrupting the data storage 20. The entryway 5 is physically attached to an opening of the remate data center. Additional system components such as security cameras or alarms to indicate an open or closed door may be installed in the entryway. All electrical equipment including security cameras is housed in the entryway.

The entryway 5 is equipped with an exterior door 25 that will allow access from the outside environment to the entryway 5, which will consist of an atrium area. The entryway 5 will be equipped with an interior door 30 that will allow the individual to enter the data center 15. Both the exterior door 25 and the interior door 30 must provide an airtight seal when closed. Safeguards are provided that prevent the exterior door and interior door from being open at the same time. Safeguards may include an alarm to notify personnel in the entryway or a mechanical or electrical lock on the exterior door 25 and interior door 30. An override will be provided to allow the opening of the exterior door or interior door to prevent a person from being locked in the entryway or data center.

The technician will enter the entryway 5 from the outside through the exterior door 25. As the person enters the entryway a large blower system 35 forces a stream of air over the person to dislodge dust particles from the person's clothing. The blower system 35 may be positioned over the person's head as he or she enters the entryway or may be positioned on the sides as well.

The blower system 35 will be positioned proximate to the exterior door 25 as the person enters the entryway.

The dust particles that are dislodged from the person's clothing would be filtered through a filtration system that filters the air within the entryway. Many different types of filtration systems are available and no specific system is being claimed.

An entryway air conditioning system 45 will be included to control the humidity within the entryway 10. The entryway air conditioning system 45 will help to control the humidity within the entryway. A separate air conditioning system 50 will be provided for the data center to control the temperature and the humidity within the data center. The two air conditioning systems will operate independently of each other.

A moisture monitor 60 with accompanying displays will be placed in the entryway to monitor the moisture content in the entryway space. The moisture monitor will be equipped with a moisture alarm if excessive moisture is detected in the entryway.

Additionally, the modular data center will have its own source of power which will operate all the components of the system including all monitors and alarms, the filtration system and the air conditioning systems.

The inventor claims:

1. An entryway for a modular data center which is comprised of:
   a data storage facility,
   wherein the data storage facility has a predetermined shape,
   wherein the data storage facility has defined walls,
   wherein the data storage facility has a defined floor,
   wherein the data storage facility has a defined ceiling, wherein the entryway is attached to the data storage facility,
wherein an opening in the entryway is provided to allow access to the data center,
wherein the entryway has a defined structure with defined walls, a defined floor and a defined ceiling,
an exterior door,
wherein the exterior door is affixed to the entryway wherein the exterior door can be sealed,
an interior door,
wherein the interior door is affixed to the entryway,
wherein the interior door is affixed to the data center,
wherein the interior door can be sealed,
an interlock,
wherein the interlock prevents the interior door and exterior door from remaining open at the same time,
wherein the exterior door and interior door cannot be opened at the same time,
a blower system,
wherein the blower system provides a stream of air, a filtration system,
wherein the filtration system filters the environment within the entryway,
an air conditioning system for the entryway,
wherein the air conditioning system for the entryway removes humidity and maintains a desired temperature for the entryway,
an air conditioning system for the data center,
wherein the air conditioning system for the data center removes humidity and maintains a desired temperature for the entryway,
a moisture monitor,
wherein the moisture monitor measures the moisture in the entryway,
a power source for the entryway,
a power source for the modular data center.

2. An entryway for a modular data center as described in claim 1 wherein the blower system is located above a person entering the entryway.

3. An entryway for a modular data center as described in claim 1 wherein the blower system is located on the side of the person entering the entryway.

4. An entryway for a modular data center as described in claim 1 wherein the interlock is mechanical.

5. An entryway for a modular data center as described in claim 1 wherein the interlock is electrical.

6. An entryway for a modular data center as described in claim 1 wherein an override is provided for the interlock.

\* \* \* \* \*